(12) United States Patent
Chambers et al.

(10) Patent No.: US 6,976,204 B1
(45) Date of Patent: Dec. 13, 2005

(54) CIRCUIT AND METHOD FOR CORRECTING ERRONEOUS DATA IN MEMORY FOR PIPELINED READS

(75) Inventors: Eric G. Chambers, Austin, TX (US); James R. Magro, Austin, TX (US); Dan S. Mudgett, Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 609 days.

(21) Appl. No.: 09/882,417

(22) Filed: Jun. 15, 2001

(51) Int. Cl.$^7$ .......................... G11C 29/00; H03M 13/00
(52) U.S. Cl. ........................ 714/763; 714/48; 714/758
(58) Field of Search ................................. 714/763, 758, 714/764, 48

(56) References Cited

U.S. PATENT DOCUMENTS

| | | | |
|---|---|---|---|
| 5,978,952 A | 11/1999 | Hayek et al. ............... | 714/764 |
| 6,101,614 A * | 8/2000 | Gonzales et al. ............... | 714/6 |
| 6,560,725 B1 * | 5/2003 | Longwell et al. ............. | 714/54 |
| 6,591,393 B1 * | 7/2003 | Walker et al. ............... | 714/763 |

* cited by examiner

*Primary Examiner*—Albert Decady
*Assistant Examiner*—Esaw Abraham
(74) *Attorney, Agent, or Firm*—Meyertons Hood Kivlin Kowert & Goetzel, P.C.; B. Noël Kivlin; Stephen J. Curran

(57) ABSTRACT

A circuit and method for correcting erroneous data in memory for pipelined reads. A memory controller includes a control unit, a storage unit and an error detection and correction unit. The control unit is configured to read data including an associated error correction code from a memory subsystem in response to a memory read request. The error detection and correction unit is coupled to receive the data and configured to determine whether an error exists in that data based upon the associated error correction code. The control unit is configured to store an indication in the storage unit that the data corresponding to the memory read request is erroneous. The control unit is further configured to detect the indication in the storage unit and to responsively perform a subsequent read of the data from the memory subsystem and to write a corrected version of the data back to the memory subsystem.

15 Claims, 4 Drawing Sheets

CIRCUIT AND METHOD FOR CORRECTING ERRONEOUS DATA IN MEMORY FOR PIPELINED READS

BACKGROUND OF THE INVENTION

1. Field of the Invention

This invention relates to computer systems and, more particularly, to memory controllers that correct errors in data stored within computer system memories.

2. Description of the Related Art

A computer system may employ error correcting code (ECC) circuits which allow the system to detect and/or correct erroneous data. The ECC circuits may be used in various capacities by the system. In some systems, a memory controller may employ an ECC circuit to correct errors in data returned from the system memory. A separate ECC circuit may be used in the processor.

Many memory controllers include the ECC circuit in the data path to and from main memory. In such memory controllers, the ECC circuit may generate an error correction code for data written to memory. As read requests arrive, a memory request queue and associated command logic processes the read requests by placing the read request onto a command bus. When that data is returned from memory, the ECC circuit may use the corresponding error correction code to detect an error in the data. Many ECC circuits also correct the error on the fly and since the ECC circuit is in the data path, the corrected data may be sent to the requesting device. This method is common and may provide a relatively fast data return time, especially for pipelined reads. However, the erroneous data is left in memory.

To correct the erroneous data stored in memory, another type of memory controller may be used. In such a memory controller, a read buffer may be employed which stores the address and data returned from each read request. The ECC circuit may first correct the data and then store the corrected version in the buffer. Alternatively, the erroneous data may be stored in the buffer and corrected at a later time. In the former case, once any pending read requests are processed, the corrected data corresponding to each read request may be subsequently written back into memory into the respective memory locations. In the latter case, the erroneous data may be read out of the buffer and the ECC circuit may correct the data. The corrected data corresponding to each read request may be subsequently written back into memory into the respective memory location.

Thus in this type of memory controller, the erroneous data in memory may be replaced by a corrected version. Replacing erroneous data with a corrected version is sometimes referred to as scrubbing. However, as described above, a buffer may be used that is large enough to hold the entire data path. As data bus widths increase, the size of such a buffer may become necessarily large. In addition, other factors such as latencies associated with the data arrival and read wait states may also necessitate a large buffer. A corresponding increase in the area required to manufacture the die may also be necessary. Since there is a direct relationship between die area and manufacturing costs, it may be desirable to have a memory controller that provides memory data scrubbing without the use of a buffer which stores the data returned from a read request.

SUMMARY OF THE INVENTION

Various embodiments of a circuit and method for memory scrubbing for pipelined reads are disclosed. In one embodiment, a memory controller includes a control unit, a storage unit and an error detection and correction unit. The control unit is coupled to the storage unit and configured to read data including an associated error correction code from a memory subsystem in response to a memory read request. The storage unit may be any type of storage such as a register bank, for example. The error detection and correction unit is coupled to receive the data and configured to determine whether an error exists in that data based upon the associated error correction code. The control unit is configured to store an indication in the storage unit that the data corresponding to the memory read request is erroneous. The control unit is further configured to detect the indication in the storage unit and to responsively perform a subsequent read of the data from the memory subsystem and to write a corrected version of the data back to the memory subsystem.

In one particular implementation, the error detection and correction unit is configured to provide the corrected version of the data in response to the subsequent read of the data. In another implementation, the indication includes an address in the memory subsystem of the erroneous data corresponding to the read request.

In yet another implementation, the control unit is configured to inhibit accepting an additional memory read request in response to the indication. In addition, the control unit is configured to accept the additional memory read request in response to the subsequent read of the data and a corrected version of the data being written to the memory subsystem.

Figure 1:
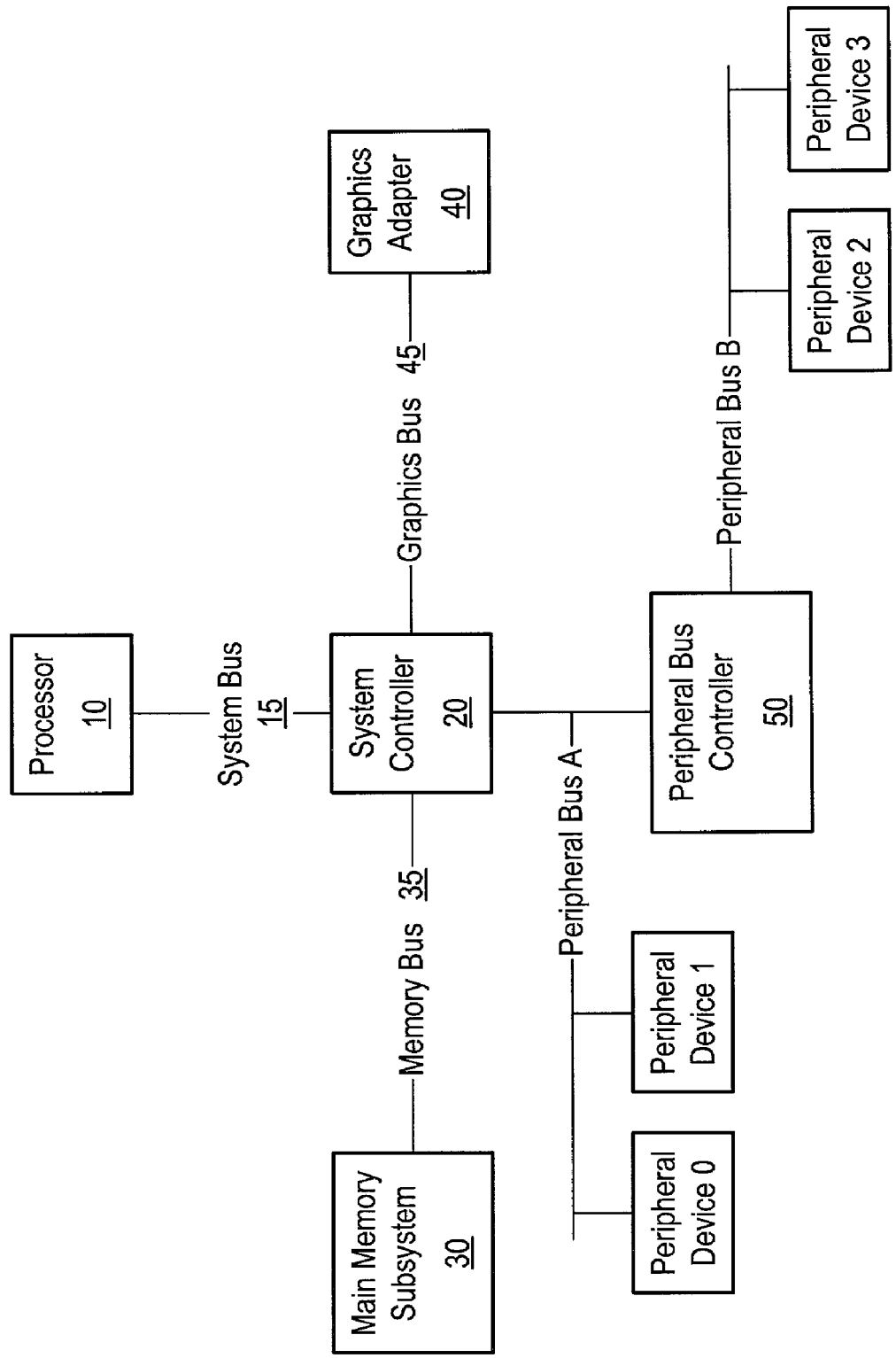
FIG. 1 is a block diagram of one embodiment of a computer system.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENTS

Turning now to FIG. 1, a block diagram of one embodiment of a computer system is shown. The computer system includes a processor 10 which is coupled to a system controller 20 via a system bus 15. A main memory subsystem 30 is coupled to system controller 20 through a memory bus 35. The computer system also includes a graphics adapter 40 that is coupled to system controller 20 through a graphics bus 45. Further, a peripheral controller 50 is coupled to system controller 20 through a peripheral bus A. Additionally, various peripheral devices are coupled to peripheral bus A and a peripheral bus B, such as peripheral devices 0–3.

In the illustrated embodiment, the computer system may be representative of a typical data processing system such as a personal computer platform. It is noted however that in other embodiments, the computer system may be representative of other types of computing platforms, such as a workstation or a server, for example.

Processor 10 is illustrative of an x86 class processor such as an Athlon™ processor from Advanced Micro Devices, Inc. However, it is contemplated that other types of processors may be used in other embodiments.

System controller 20 may sometimes be referred to as a north bridge controller. It may be responsible for handling all transactions to and from processor 10 as well as memory requests to main memory subsystem 30. System controller 20 may also be responsible for handling graphics subsystem transactions and peripheral bus transactions.

As will be described in greater detail below, system controller 20 may handle memory transactions through a memory controller. The memory controller may control read requests and may return data that is free from errors. In addition, the memory controller may be configured to correct erroneous data that is stored in main memory subsystem 30.

Figure 2:
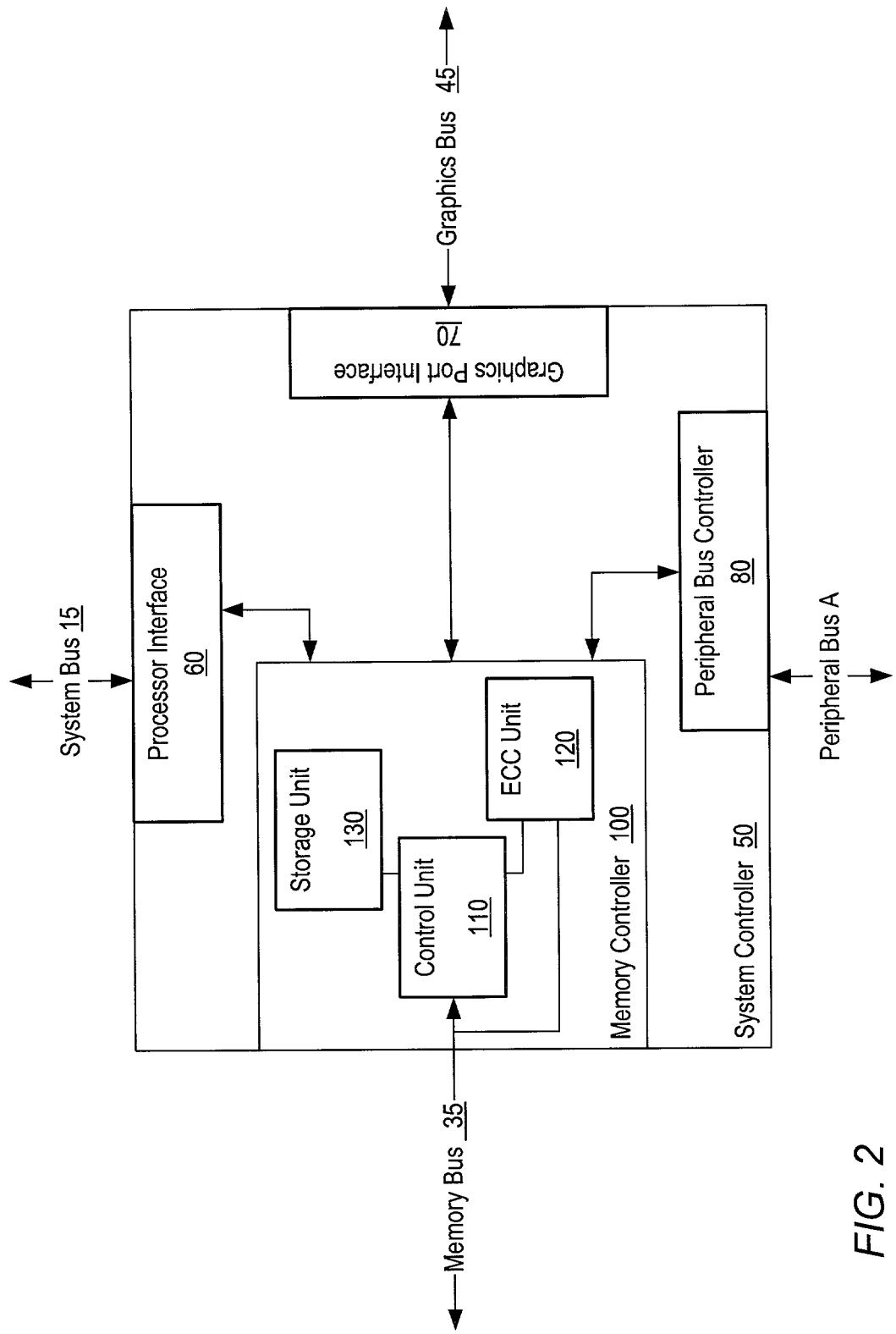
FIG. 2 is a block diagram of one embodiment of a system controller.

Referring to FIG. 2, a block diagram of one embodiment of a system controller 20 is shown. System controller 20 includes a processor interface 60, a peripheral bus controller 80, a graphics port interface 70 and a memory controller 100.

Processor interface 60 may be configured to handle transactions to and from a system processor such as processor 10 of FIG. 1. In FIG. 2, processor interface 60 may contain one or more queues for temporarily storing transaction requests and one or more buffers for storing read data that may be returned from a main memory such as main memory subsystem 30 of FIG. 1. Processor 10 may communicate with processor interface 60 of FIG. 2 via system bus 15.

Graphics port interface 70 is typically referred to as an Accelerated Graphics Port (AGP) and may be configured to handle transaction requests between graphics adapter 40 and main memory subsystem 30, both of FIG. 1.

In FIG. 2, peripheral bus controller 80 may include arbitration logic which allows peripheral bus transaction control to and from peripheral bus A. Peripheral bus A may be representative of a Peripheral Component Interconnect (PCI) bus. Peripheral bus controller 80 may also include buffers for storing various transaction requests.

In the illustrated embodiment, memory controller 100 includes a control unit 110, a storage unit 130 and an error correction code (ECC) unit 120. ECC unit 120 may be configured to detect and correct errors in data received from main memory subsystem 30 of FIG. 1 and is sometimes referred to as an error correction and detection unit. As will be described in more detail below, storage unit 130 of FIG. 2 may be configured to store an indication, including an address, that data associated with a read request has an error. Storage unit 130 may also be configured to detect the indication and to generate a read request of the erroneous data and to generate a write request of a corrected version of the data to main memory subsystem 30 of FIG. 1.

Control unit 110 may be configured to handle memory transaction requests from processor 10, graphics adapter 40 of FIG. 1 and peripheral bus controller 70 of FIG. 2. As will be described in greater detail below, control unit 110 may also be configured to accept the read request from storage unit 130 and to perform the subsequent read of the erroneous data in response to the read request and to write the corrected version of the data to main memory subsystem 30 of FIG. 1.

Figure 3:
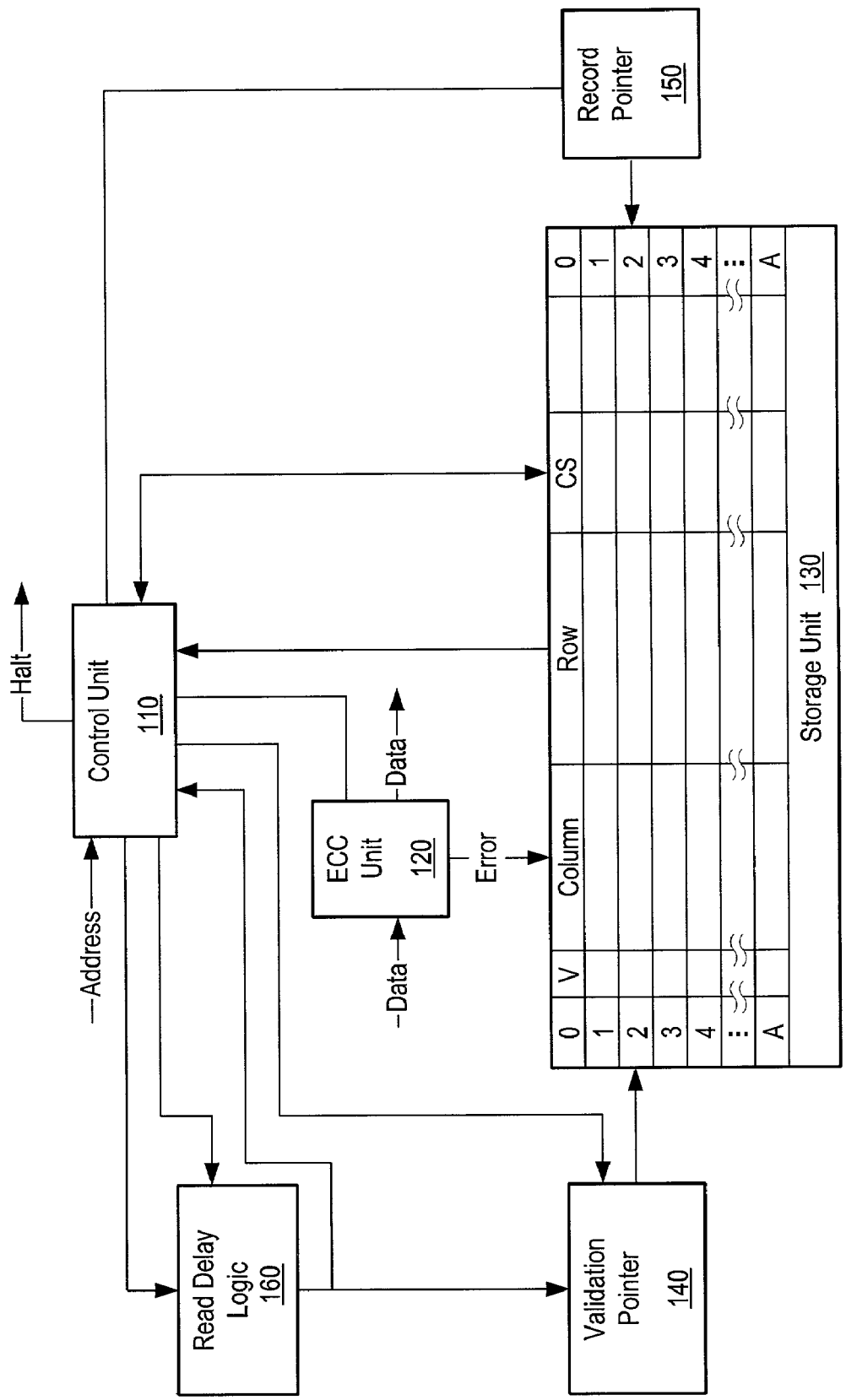
FIG. 3 is a block diagram of one embodiment of a memory controller.

Turning to FIG. 3, a block diagram of one embodiment of memory controller 100 of FIG. 2 is shown. Circuit components that correspond to those shown in FIG. 2 are numbered identically for simplicity and clarity. Memory controller 100 includes a control unit 110 which is coupled to a storage unit 130 and an error correction code (ECC) unit 120. In addition, memory controller 100 includes a validation pointer 140, a record pointer 150 and a read delay logic unit 160 which are coupled to control unit 110.

Control unit 110 may include circuitry which works in conjunction with a memory command queue (not shown) and memory command logic (not shown) within memory controller 100 to keep track of read requests. The memory command queue and logic may be typical of most memory controllers available today. As each read request is accepted into the memory command queue, control unit 110 may cause read pointer 150 to point to the next available location in storage unit 130 so that the address of the read requests are recorded (stored) in storage unit 130. In the case of pipelined reads, several read requests may be accepted and processed by the memory command queue before any data is returned from memory. Thus, storage unit 130 may need to be large enough to account for the number of read requests which may be outstanding before an error is detected. Therefore, the size of storage unit 130 may be a function of the delays described below.

There may be an inherent delay from the time a read command is issued to memory subsystem 30 of FIG. 1 and the time that data is returned onto the data path and reaches ECC unit 120 of FIG. 2. This type of delay may be caused by several factors such as column address strobe latencies and whether the memory modules are registered. Additionally, there may be a delay associated with ECC unit 120 checking the data integrity.

In an alternative embodiment, the delays described above may be small enough such that storage unit 130 may be configured to store only those addresses corresponding to read requests which return erroneous data.

When data is returned from memory subsystem 30 of FIG. 1, ECC unit 120 of FIG. 2 checks the data and the error correction code associated with the data and determines whether the data is erroneous. If the data has an error, ECC unit 120 may correct the error and then forward the corrected data along the data path to the requesting device. Additionally, ECC unit 120 indicates the error condition to control unit 110. Once control unit 110 acknowledges the error indication, control unit 110 may provide a halt signal to the memory command queue which may prevent any further read requests from being accepted into the queue until the erroneous data in memory was been replaced with good data. However, any pending requests that have been accepted into the queue prior to the first error being detected may be allowed to be processed. It is noted that in other embodiments, control unit 100 may not halt further read requests. It is contemplated that in other embodiments the corrected version of data may be written to memory during idle periods or at the end of a burst.

As data is being returned for each read request that has been accepted and processed, control unit 110 may cause validation pointer 140 to increment to point to the location in storage unit 130 that holds the address of the data currently being returned. In addition, read delay logic 160 provides a delay to validation pointer 140 for each read request that has been issued so that as data is returned onto the data path, validation pointer 140 points to the correct address stored in storage unit 130. As described above, if an error is detected in the data returned, control unit 110 causes a valid bit to be set in storage unit 130 corresponding to the address pointed to by validation pointer 140.

Once an error has been detected by ECC unit 120 and no more read requests are accepted into the memory command request queue, the data that contains erroneous data may be replaced with corrected versions of the data (i.e. memory scrubbing may now occur). After the last read command is issued to memory, control unit 110 may detect that the valid bit is set in the first location in storage unit 130. Control unit 110 may then issue a read request to the memory command request queue at the address specified by the address in the first location in storage unit 130. In one embodiment, the read request is a read-modify-write request. Thus, a read command is issued to memory and when the data is returned, ECC unit 120 detects the error and generates a corrected version of the data. The corrected version of the data is then written back to the memory location that was just read. To prevent a double error indication on the same location during memory scrubbing, control unit 110 is prevented from storing the address and causing the valid bit to be set in storage unit 130a in response to the subsequent read of the erroneous data.

Once the data is corrected for that address, an acknowledge signal from control unit 110 may cause storage unit 130 to shift out the address in the first location so that the information in the next location may be evaluated and if the valid bit is set, the data in memory at that address may be corrected. If the valid bit is not set, then storage unit 130 may shift out the address in the first location so that the information in the next location may be evaluated. This process continues until no more valid bits indicate that erroneous data is present in memory. It is noted that although the valid bit is described as being set to indicate that there is erroneous data, it is contemplated that in other embodiments, the valid bit may be cleared to indicate erroneous data. In such embodiments, the associated detection logic would be correspondingly configured to detect such an indication.

Figure 4:
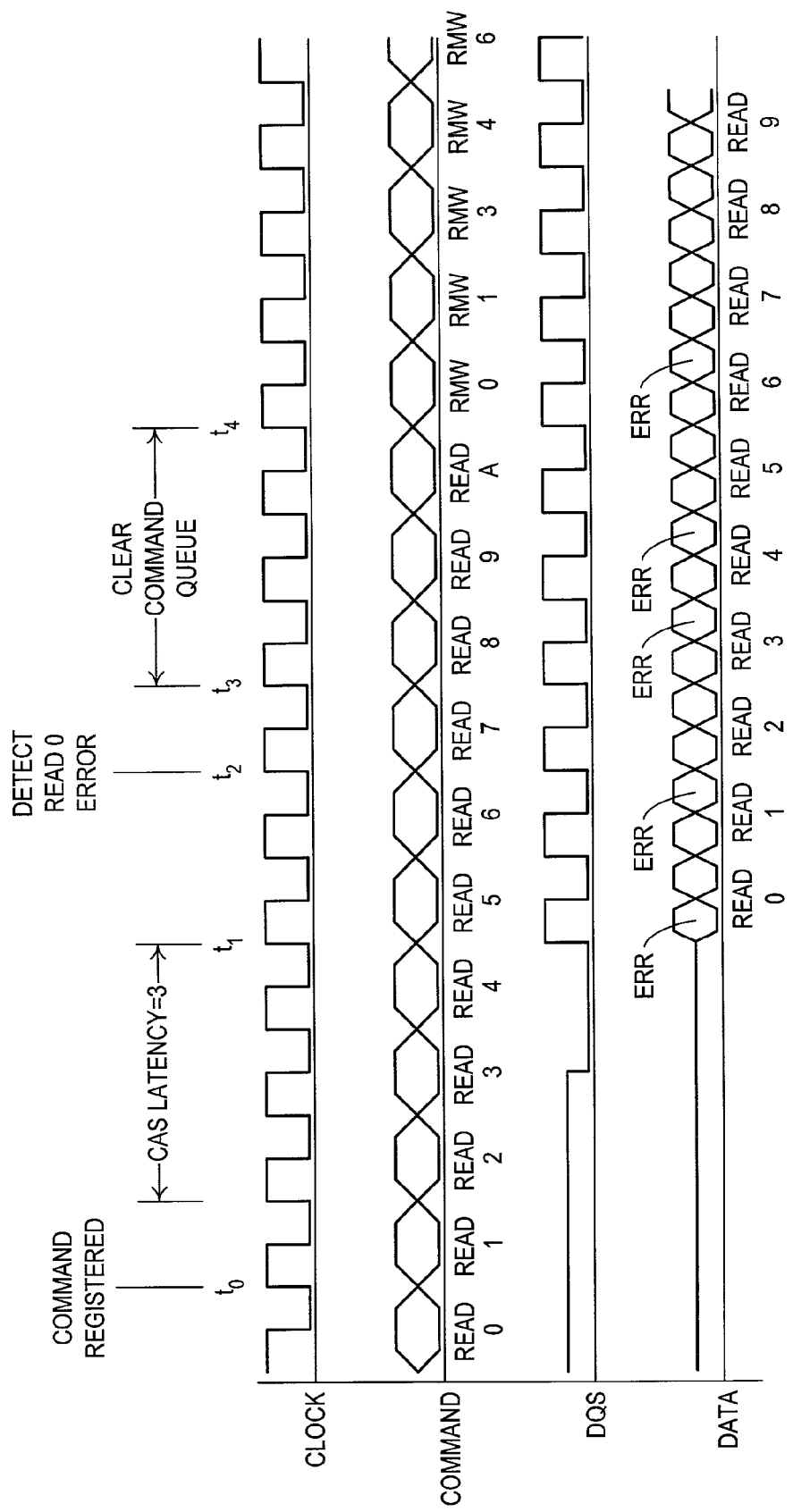
FIG. 4 is a timing diagram illustrating the signal timing during operation of one embodiment of the memory controller of FIG. 3.

Referring to FIG. 4, a timing diagram illustrating the signal timing during operation of one embodiment of the memory controller of FIG. 3 is shown. The timing diagram includes signal timing for four signals: clock, command bus, data strobe (DQS) and data.

Referring collectively to FIG. 1 through FIG. 4, during operation, a clock signal may drive the logic within memory controller 100. During a pipelined read operation, the memory command logic (not shown) places read requests onto the command bus as shown in FIG. 4 on the command signal line after they have been placed in a memory command queue (not shown). After read 0 is placed onto the command bus, it is registered in main memory subsystem 30 of FIG. 1 as shown at timing mark t0 of FIG. 4. As described above, a latency of three additional cycles is shown due to column address strobe (CAS). Thus at timing mark t1, and the DQS signal becomes active and the data corresponding to read 0 appears on the data bus after a delay of four clock cycles. In the illustrated embodiment, the read 0 data is erroneous, as are the read 1, read 3, read 4 and read 6 data. It is noted that in other embodiments, memory modules that do not register the read command may be used.

The read 0 data is passed through ECC unit 120 and at timing mark t2 an error is detected two clock cycles after the read 0 data is placed onto the data bus. Thus, seven read commands have been placed on the command bus when the first error is detected. When the error is detected, control unit 110 issues a halt command to the memory command queue to inhibit the command queue from accepting any further read requests. After one clock cycle the command queue may stop accepting requests. If there are any pending read commands in the memory command queue, they are allowed to be placed onto the command bus. Thus in FIG. 4, read 8, read 9 and read A commands are placed onto the command bus starting at timing mark t3. In the illustrated embodiment, 11 read requests are placed onto the command bus. It is noted that in other embodiments, other numbers of reads requests may be placed on the command bus since the latencies described in this embodiment may be different in other embodiments.

Referring back to timing mark t1, as read commands are placed onto the command bus, the addresses of each of the reads are stored in storage unit 130 of FIG. 3. As described above, the number of storage locations in storage unit 130 is dependent upon the latencies previously described. Thus, in the illustrated embodiment, storage unit 130 may accommodate 11 addresses.

Referring to timing mark t1, as data is placed onto the data bus by main memory subsystem 30 of FIG. 1 and analyzed by ECC unit 120 of FIG. 3 an error is detected in the read 0 data at timing mark t2. Control unit 110 of FIG. 3 causes the valid bit pointed to by validation pointer 140 and located in storage unit 130 to be set. Validation pointer 140 may then be incremented to the next location. The next location contains the address of the read 1 data. In this example, ECC unit 120 detects an error and so control unit 110 causes the valid bit to be set for that address. This continues for each address in storage unit 130 as the data corresponding to each read command is evaluated by ECC unit 120.

At timing mark t4 of FIG. 4, the last read command, read A, is issued onto the command bus. Control unit 110 of FIG. 3 detects the valid bit of the first entry of storage unit 130. Control unit 110 then performs a read request and a subsequent write request to the memory command logic in the form of a read-modify-write (RMW) command. Thus in FIG. 4, the RMW commands are shown as one command on the command bus for simplicity and ease of describing the operation. The RMW command is directed to the address of the data corresponding to read 0. In response to the read portion of the RMW command, the corresponding data is returned and the ECC unit 120 corrects the error. Control unit 110 then performs a write to the same location that was just read, thereby replacing the erroneous data with a corrected version of the data. Control unit 110 then performs another RMW request to the memory command logic for the address stored in storage unit 130 corresponding to read 1. This process continues and control unit 110 makes RMW requests in response to detecting a set valid bit for each address stored in storage unit 130. It is noted that in other embodiments other commands may be used to perform the desired operation as described above.

Numerous variations and modifications will become apparent to those skilled in the art once the above disclosure is fully appreciated. It is intended that the following claims be interpreted to embrace all such variations and modifications.

What is claimed is:

1. A memory controller comprising:
    a control unit configured to read data including an associated error correction code from a memory subsystem in response to a memory read request;
    a storage unit coupled to said control unit;
    an error detection and correction unit coupled to receive said data and configured to determine whether an error exists in said data based upon said associated error correction code;

wherein said control unit is configured to store an indication in said storage unit that said data corresponding to said memory read request is erroneous; and wherein said control unit is further configured to subsequently detect said indication in said storage unit and to responsively perform a subsequent read of said data from said memory subsystem and to write a corrected version of said data within said memory subsystem.

2. The memory controller as recited in claim 1, wherein said error detection and correction unit is further configured to provide said corrected version of said data in response to said subsequent read of said data.

3. The memory controller as recited in claim 1, wherein said indication includes an address in said memory subsystem of said data corresponding to said read request.

4. The memory controller as recited in claim 1, wherein said control unit is further configured to inhibit accepting an additional memory read request in response to said indication.

5. The memory controller as recited in claim 4, wherein said control unit is further configured to accept said additional memory read request in response to said subsequent read of said data from said memory subsystem and a corrected version of said data being written to said memory subsystem.

6. A data processing system comprising:

a processor;

a memory subsystem configured to store data;

a system controller including a memory controller coupled between said processor and said memory subsystem, wherein said memory controller includes:

a control unit configured to read data including an associated error correction code from a memory subsystem in response to a memory read request;

a storage unit coupled to said control unit;

an error detection and correction unit coupled to receive said data and configured to determine whether an error exists in said data based upon said associated error correction code;

wherein said control unit is configured to store an indication in said storage unit that said data corresponding to said memory read request is erroneous; and wherein said control unit is further configured to subsequently detect said indication in said storage unit and to responsively perform a subsequent read of said data from said memory subsystem and to write a corrected version of said data within said memory subsystem.

7. The data processing system as recited in claim 6, wherein said error detection and correction unit is further configured to provide said corrected version of said data in response to said subsequent read of said data.

8. The data processing system as recited in claim 6, wherein said indication includes an address in said memory subsystem of said data corresponding to said read request.

9. The data processing system as recited in claim 6, wherein said control unit is further configured to inhibit accepting an additional memory read request in response to said indication.

10. The data processing system as recited in claim 9, wherein said control unit is further configured to accept said additional memory read request in response to said subsequent read of said data from said memory subsystem and a corrected version of said data being written to said memory subsystem.

11. A method of correcting erroneous data in a memory of a memory subsystem, said method comprising:

reading data including an associated error correction code from said memory subsystem in response to a memory read request;

receiving said data and determining whether an error exists in said data based upon said associated error correction code;

storing an indication that said data corresponding to said memory read request is erroneous; and subsequently detecting said indication and responsively performing a subsequent read of said data from said memory subsystem and writing a corrected version of said data within said memory subsystem.

12. The method as recited in claim 11 further comprising providing said corrected version of said data in response to said subsequent read of said data.

13. The method as recited in claim 11, wherein said indication includes an address in said memory subsystem of said erroneous data corresponding to said read request.

14. The method as recited in claim 11 further comprising inhibiting accepting an additional memory read request in response to said indication.

15. The method as recited in claim 14 further comprising accepting said additional memory read request in response to performing said subsequent read of said data from said memory subsystem and to said writing of said corrected version of said data to said memory subsystem.

* * * * *